US012599014B2

(12) United States Patent
Chang Chien et al.

(10) Patent No.: US 12,599,014 B2
(45) Date of Patent: Apr. 7, 2026

(54) PACKAGE DEVICE AND MANUFACTURING METHOD THEREOF

(71) Applicant: POWERTECH TECHNOLOGY INC., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 436 days.

(21) Appl. No.: 17/994,409

(22) Filed: Nov. 28, 2022

(65) Prior Publication Data

US 2023/0282587 A1     Sep. 7, 2023

(30) Foreign Application Priority Data

Mar. 2, 2022     (TW) .................................. 111107443

(51) Int. Cl.
H10W 70/65          (2026.01)
H10W 70/05          (2026.01)
(Continued)

(52) U.S. Cl.
CPC ......... H10W 70/65 (2026.01); H10W 70/093 (2026.01); H10W 70/611 (2026.01);
(Continued)

(58) Field of Classification Search
CPC ............. H01L 23/5381; H01L 21/4853; H01L 21/561; H01L 21/563; H01L 21/565;

H01L 21/568; H01L 23/3135; H01L 23/49816; H01L 23/49833; H01L 23/49838; H01L 23/5385; H01L 23/5386; H01L 24/16; H01L 24/32; H01L 24/73; H01L 24/96;
(Continued)

(56) References Cited

U.S. PATENT DOCUMENTS

2014/0091473 A1*    4/2014  Len ........................ H01L 21/486
                                                                438/118
2019/0029125 A1*    1/2019  Matsuura .............. C23C 14/165
(Continued)

FOREIGN PATENT DOCUMENTS

TW          202029449 A      8/2020
TW          202139298 A      10/2021

*Primary Examiner* — Jacob Y Choi
*Assistant Examiner* — Neil R Prasad
(74) *Attorney, Agent, or Firm* — Winston Hsu

(57) ABSTRACT

A package device and a manufacturing method thereof are provided. The package device includes a substrate, a plurality of conductive pillars, a redistribution layer, at least one bridge chip, at least two active chips, an encapsulant, and an underfill layer. The conductive pillars are disposed on the substrate side by side, the redistribution layer is disposed on the conductive pillars, and the bridge chip is disposed between the substrate and the redistribution layer. The active chips are disposed on the redistribution layer, the bridge chip is coupled between the active chips, and the encapsulant is disposed on the redistribution layer and surrounds the active chips. The underfill layer is disposed between adjacent two of the conductive pillars and between one of the conductive pillars and the bridge chip.

18 Claims, 8 Drawing Sheets

(51) Int. Cl.

| | |
|---|---|
| *H10W 70/60* | (2026.01) |
| *H10W 74/01* | (2026.01) |
| *H10W 74/10* | (2026.01) |
| *H10W 74/15* | (2026.01) |
| *H10W 90/00* | (2026.01) |
| *H10W 72/00* | (2026.01) |
| *H10W 74/00* | (2026.01) |

(52) U.S. Cl.
CPC ....... *H10W 74/012* (2026.01); *H10W 74/014* (2026.01); *H10W 74/016* (2026.01); *H10W 74/019* (2026.01); *H10W 74/121* (2026.01); *H10W 74/15* (2026.01); *H10W 90/00* (2026.01); *H10W 90/401* (2026.01); *H10W 90/701* (2026.01); *H10W 72/0198* (2026.01); *H10W 74/00* (2026.01); *H10W 74/142* (2026.01); *H10W 90/724* (2026.01); *H10W 90/734* (2026.01)

(58) Field of Classification Search
CPC ................ H01L 24/97; H01L 25/0655; H01L 2224/16235; H01L 2224/32225; H01L 2224/73204; H01L 2224/95001; H01L 2224/96; H01L 2224/97; H01L 2924/1616; H01L 2924/16235; H01L 2924/16251; H01L 2924/1811; H01L 2924/18161; H01L 2924/182
See application file for complete search history.

(56) References Cited

U.S. PATENT DOCUMENTS

| | | | |
|---|---|---|---|
| 2020/0328161 A1 | 10/2020 | Lin | |
| 2021/0202396 A1* | 7/2021 | Wu ..................... | H01L 23/5383 |
| 2021/0280519 A1* | 9/2021 | Chang ................ | H01L 23/5226 |
| 2021/0305132 A1* | 9/2021 | Karhade ............ | H01L 23/5381 |
| 2022/0270976 A1* | 8/2022 | Sun ......................... | H01L 24/14 |
| 2022/0344174 A1* | 10/2022 | Lai ...................... | H01L 21/6835 |
| 2023/0154892 A1* | 5/2023 | Tu ........................... | H01L 24/17 |
| | | | 257/668 |

* cited by examiner

PACKAGE DEVICE AND MANUFACTURING METHOD THEREOF

BACKGROUND OF THE INVENTION

1. Field of the Invention

The present invention relates to a package device and a manufacturing method thereof, and particularly to a package device utilizing a bridge chip to couple active chips and a manufacturing method thereof.

2. Description of the Prior Art

Recently, in order to integrate various functions to meet customer requirements, it has been developed to encapsulate multiple active chips in the same package device. However, as the active chips have more functions or higher computing power, the requirements for interconnection structures between the active chips is higher. For this reason, to improve the interconnection efficiency between the active chips and reduce manufacturing cost and manufacturing complexity of the package device is an objective in this field.

SUMMARY OF THE INVENTION

According to an embodiment of the present invention, a package device is provided and includes a substrate, a plurality of first conductive pillars, a redistribution layer, at least one bridge chip, at least two active chips, an encapsulant, and a first underfill layer. The first conductive pillars are disposed on the substrate side by side, the redistribution layer is disposed on the first conductive pillars, and the bridge chip is disposed between the substrate and the redistribution layer. The active chips are disposed on the redistribution layer, and the bridge chip is coupled between the active chips. The encapsulant is disposed on the redistribution layer and surrounds the active chips. The first underfill layer is disposed between adjacent two of the first conductive pillars and between one of the first conductive pillars and the bridge chip.

According to another embodiment of the present invention, a manufacturing method of a package device is provided. First, a redistribution layer is formed on a first carrier, and then, at least two active chips are disposed on the redistribution layer. After that, an encapsulant is formed on the redistribution layer, in which the encapsulant surrounds the active chips. Subsequently, the redistribution layer, the active chips and the encapsulant are transferred to a second carrier to expose a surface of the redistribution layer opposite to the active chips. Then, a plurality of first conductive pillars are formed on the surface of the redistribution layer opposite to the active chips. Later, at least one bridge chip is disposed on the redistribution layer, and then, the second carrier is removed. After that, the first conductive pillars are bonded to a substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
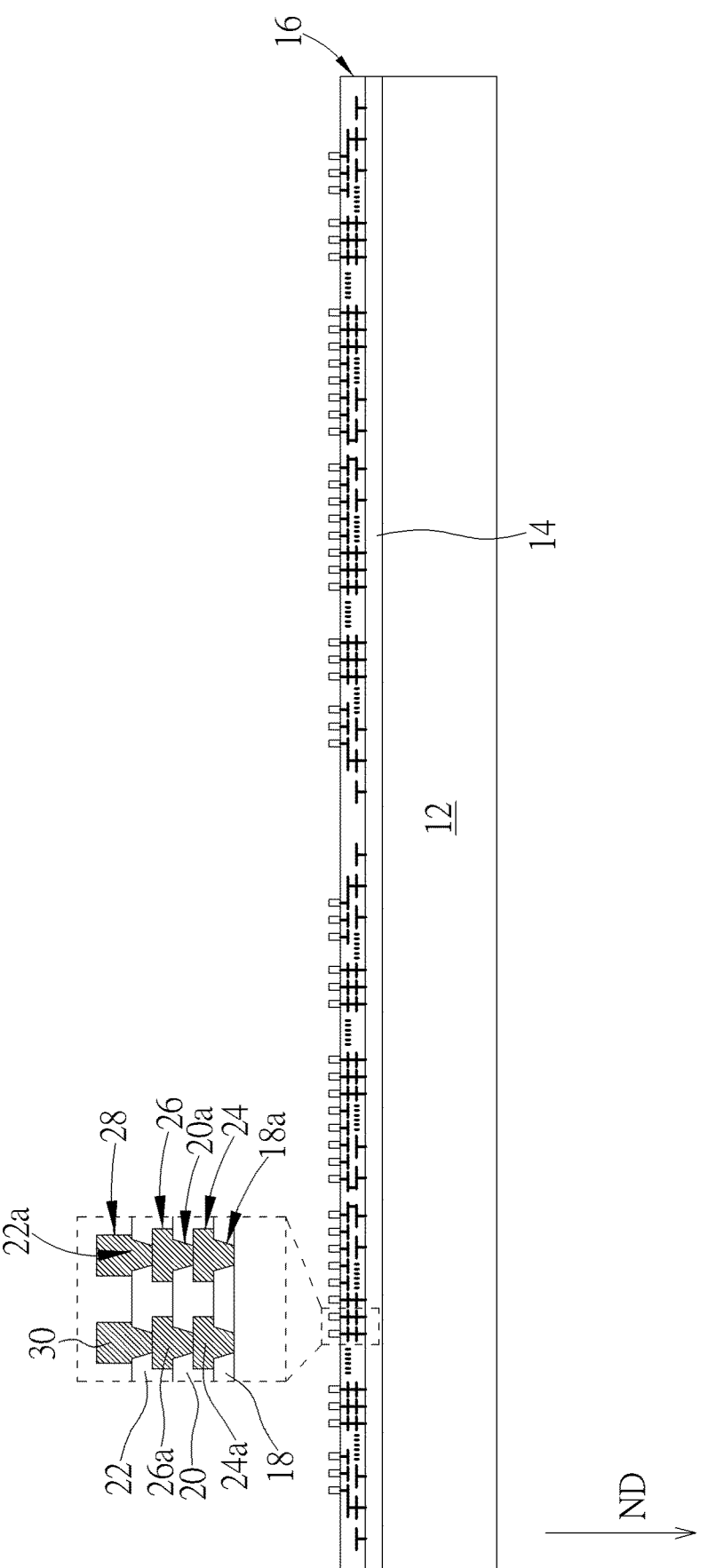
FIG. 1 to FIG. 7 schematically illustrate a manufacturing method of a package device according to an embodiment of the present invention.

The contents of the present disclosure will be described in detail with reference to specific embodiments and drawings. In order to make the contents clearer and easier to understand, the following drawings may be simplified schematic diagrams, and elements therein may not be drawn to scale. The numbers and sizes of the elements in the drawings are just illustrative and are not intended to limit the scope of the present disclosure.

Spatially relative terms, such as "above", "on", "beneath", "below", "under", "left", "right", "before", "front", "after", "behind" and the like, used in the following embodiments just refer to the directions in the drawings and are not intended to limit the present disclosure. It should be understood that the elements in the drawings may be disposed in any kind of formation known by one skilled in the related art to describe the elements in a certain way.

When one element or layer is referred to as "on" or "above" another element or another layer, it may be understood that the element or layer is "directly on" the another element or the another layer, or other element or other layer may be between them. On the contrary, when one element or layer is "directly on" another element or another layer, it may be understood that there is no element or layer between them.

When an element is referred to as being "electrically connected to" or "coupled to" another element, it may be understood that "other element may be between the element and the another element and electrically connects them to each other", or "there are no intervening elements present between the element and the another element, and the element and the another element are directly electrically connected to each other". When an element is referred to as being "directly electrically connected to" or "directly coupled to" another element, there are no intervening elements present between the element and the another element, and the element and the another element are directly electrically connected to each other.

Figure 5:
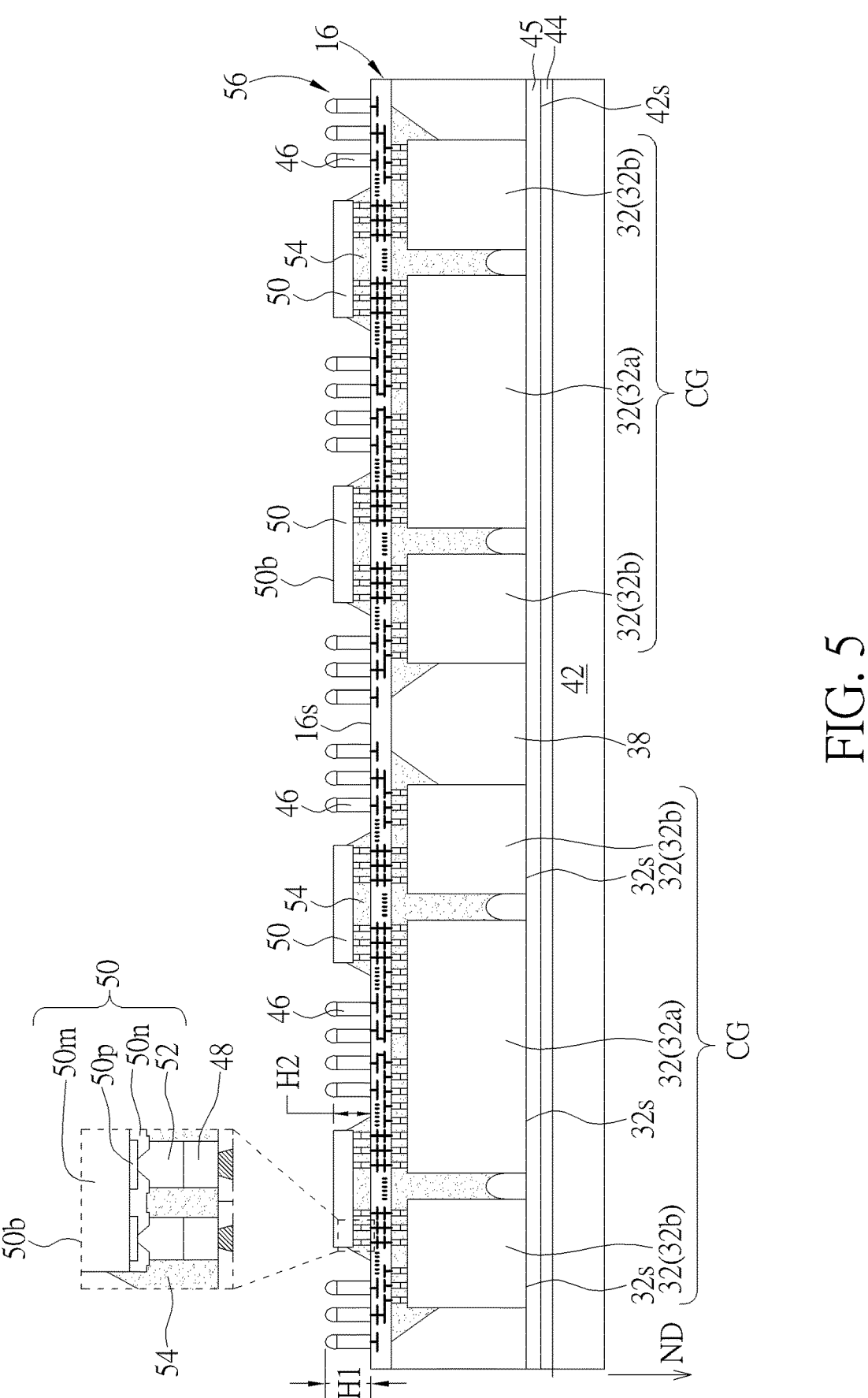
Figure 6:
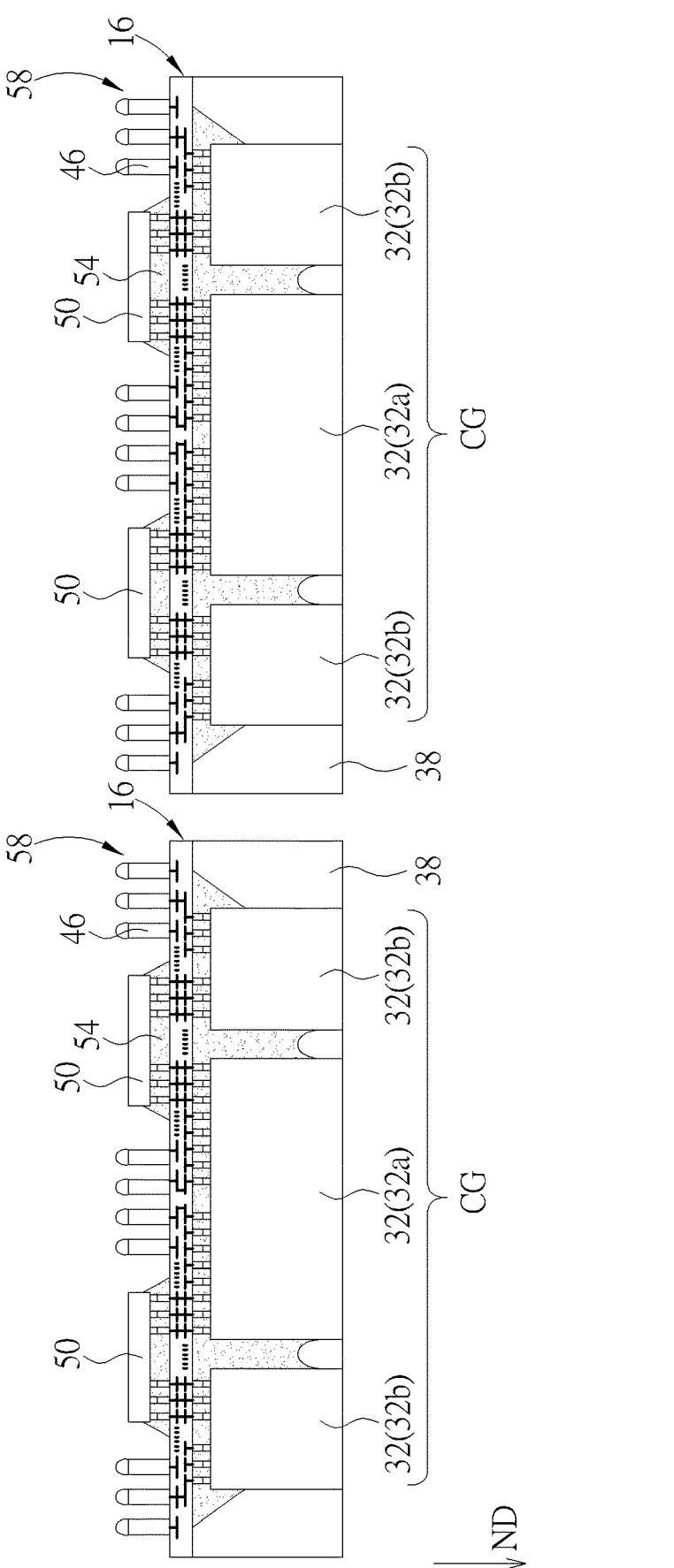
Figure 7:
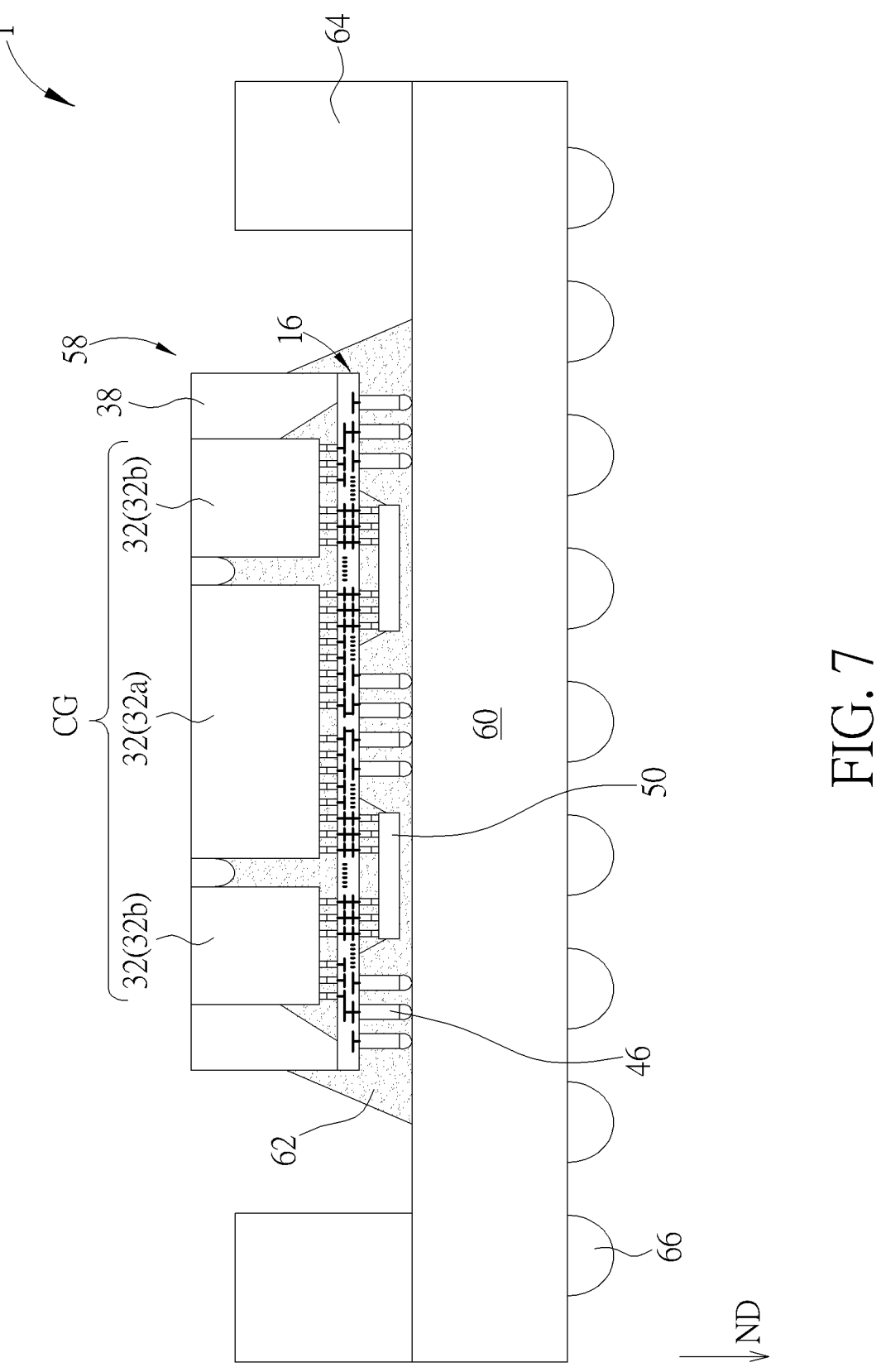

Please refer to FIG. 1 to FIG. 7. FIG. 1 to FIG. 7 schematically illustrate a manufacturing method of a package device according to an embodiment of the present invention, and FIG. 7 schematically illustrates a cross-sectional view of the package device according to an embodiment of the present invention. Structures shown in FIG. 1 to FIG. 7 may be partial structures in different steps during manufacturing package devices, and some layers or elements may be omitted, but not limited thereto. As shown in FIG. 1, a carrier 12 is provided first, in which the carrier 12 may have a release layer 14 thereon. Then, a redistribution layer 16 is formed on the release layer 14. The carrier 12 may be used to carry films or elements formed thereon, and the carrier 12 may include, for example, but not limited to, glass, wafer substrate, metal, or other suitable supporting materials. The release layer 14 may be used to separate the carrier 12 from the elements formed thereon (e.g., the package structure 40 shown in FIG. 3) after subsequent steps are completed. The releasing manner of the release layer 14 may include, for example, photo dissociation or other suitable manners. The release layer 14 may, for example, include polyethylene (PE), polyethylene terephthalate (PET), epoxy (epoxy), oriented polypropylene (OPP) or other materials suitable material, but not limited thereto.

The redistribution layer 16 may include at least one dielectric layer and at least one conductive layer. In the embodiment of FIG. 1, the redistribution layer 16 includes three dielectric layers 18, 20, 22 and three conductive layers 24, 26, 28 as an example, but not limited thereto. The dielectric layer 18, the conductive layer 24, the dielectric layer 20, the conductive layer 26, the dielectric layer 22 and the conductive layer 28 may be sequentially formed on the release layer 14. The dielectric layer 18 may have a plurality of through holes 18a, and the conductive layer 24 may be disposed on the dielectric layer 18 and may include a plurality of traces 24a extending into the through holes 18a. The dielectric layer 20 may be disposed on the conductive layer 24 and may have a plurality of through holes 20a exposing the corresponding traces 24a. The conductive layer 26 may be disposed on the dielectric layer 20 and may include a plurality of traces 26a extending into the through holes 20a for being coupled to the corresponding traces 24a. The dielectric layer 22 may be disposed on the conductive layer 26 and may have a plurality of through holes 22a. The conductive layer 28 may include a plurality of conductive bumps 30 disposed on the dielectric layer 22 and respectively disposed in the corresponding through holes 22a for being electrically connected to the corresponding traces 26a. The conductive layers of the redistribution layer may be formed by an electroplating process or other suitable process. The formation of the conductive bumps 30 may facilitate bonding and coupling with active chips disposed in subsequent step (e.g., active chip 32 in FIG. 2). The conductive bump 30 may include, for example, a multi-layer structure. The multi-layer structure may include, for example, copper, nickel, gold, other suitable materials, or a combination thereof, but not limited thereto. In some embodiments, the number of the conductive layers and the number of the dielectric layers may be adjusted according to the requirements.

It should be noted that since the redistribution layer 16 may be formed on a flat surface of the release layer 14 (or the carrier 12) before other elements are formed on the release layer 14 (or the carrier 12), the manufacturing complexity of the redistribution layer 16 may be reduced, thereby decreasing a trace pitch (e.g., fine pitch) of the same conductive layer in the redistribution layer 16. The trace pitch of a conductive layer may for example refer to a sum of a trace width (or line width) of the conductive layer and a space (or a distance) between two adjacent traces (or lines) of the conductive layer. For example, the trace width and/or the space between two adjacent traces of the redistribution layer 16 may be 2 micrometers (μm) to 10 micrometers.

Figure 2:
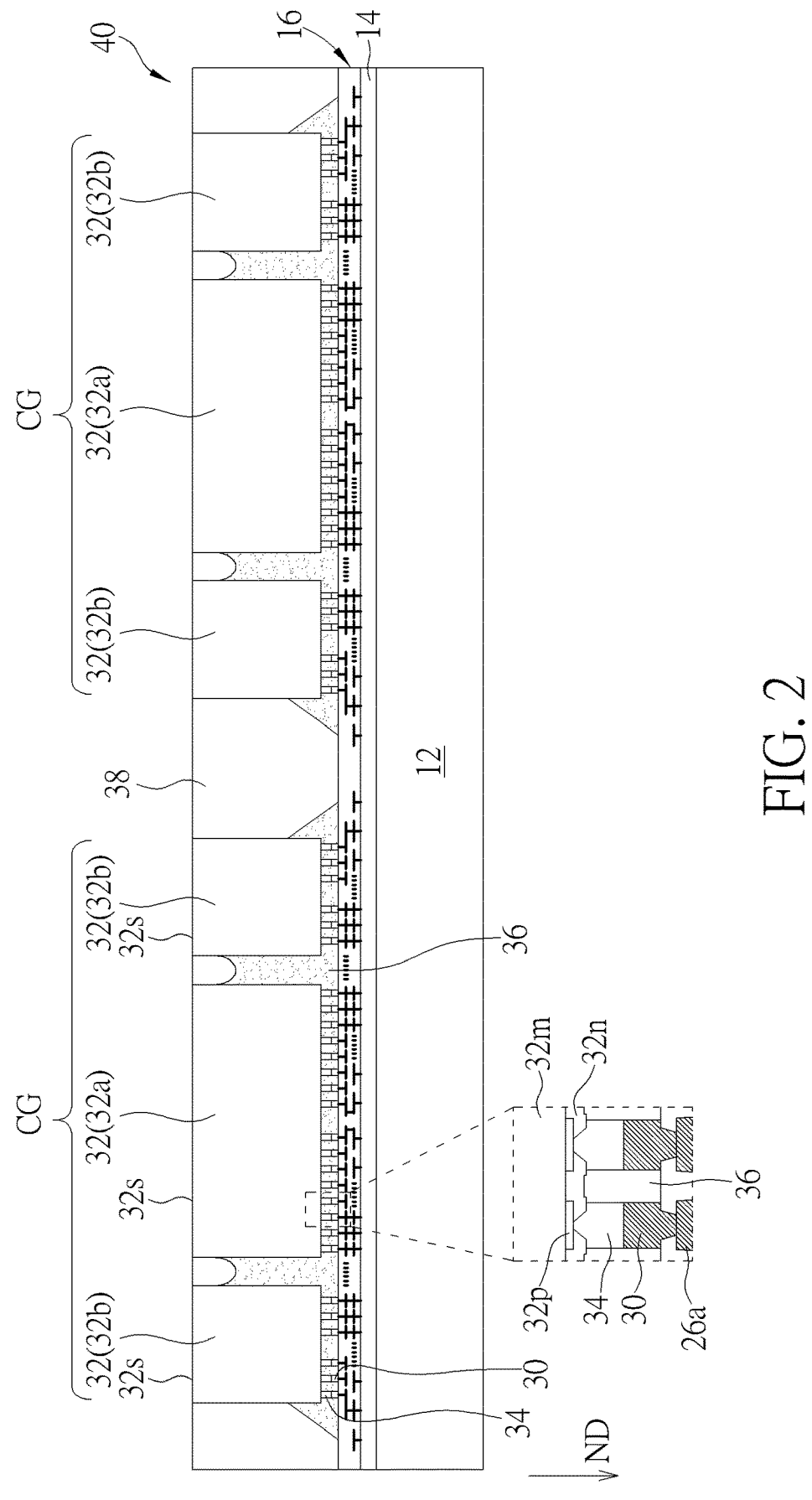

As shown in FIG. 2, after the redistribution layer 16 is formed, at least two active chips 32 may be disposed on the redistribution layer 16. In the embodiment of FIG. 2, the number of active chips 32 may be plural, and the active chips 32 may be divided into at least two chip groups CG respectively corresponding to package devices to be formed (e.g., the package device 1 as shown in FIG. 7), but not limited to this.

In the embodiment of FIG. 2, each active chip 32 may, for example, include a plurality of conductive bumps 34 to facilitate bonding with the redistribution layer 16, but not limited thereto. For example, one of the active chips 32 may further include a body portion 32m, a plurality of input/output pads 32p, and an insulating layer 32n, in which the input/output pads 32p may be disposed between the body portion 32m and the insulating layer 32n, and the insulating layer 32n has a plurality of openings exposing corresponding input/output pads 32p. The conductive bumps 34 may be formed on the corresponding input/output pads 32p, respectively. In addition, the conductive bumps 34 of the active chip 32 may be bonded to the corresponding conductive bumps 30 of the redistribution layer 16 in a face-down way through a flip-chip bonding process, so that the active chip 32 may be coupled to the redistribution layer 16. Metal solder (not shown) may be included between one of the conductive bumps 34 and the corresponding conductive bump 30 for bonding the conductive bump 34 to the corresponding conductive bump 30. The metal solder may include, for example, tin alloy solder or other suitable materials, but not limited thereto.

One of the active chips 32 may include, for example, a power management integrated circuit (PMIC) chip, a micro-electro-mechanical-system (MEMS) chip, an application-specific integrated circuit chip (ASIC), a dynamic random access memory (DRAM) chip, a static random access memory (SRAM) chip, a high bandwidth memory (HBM) chip, a system chip (SoC), a high performance computing (HPC) chip or other similar active chip, but not limited thereto. In the embodiment of FIG. 2, one of the chip groups CG may include homogeneous or heterogeneous active chips 32a, 32b. When the active chip 32a and the active chip 32b are heterogeneous, the active chip 32a and the active chip 32b may be, for example, a system chip and a high bandwidth memory chip, respectively, but not limited thereto. For example, one chip group CG may include one active chip 32a and four active chips 32b, but not limited thereto. The active chip 32 mentioned herein may refer to a chip including an active element, and the active element may include a transistor, a diode, an integrated circuit, an opto-electronic element, or other suitable elements with gain, but not limited thereto. The chip may also be referred to as a die, but is not limited thereto. The term "coupling" may also be referred to as "electrically connecting", but not limited thereto. The conductive bump 34 may, for example, comprise a multi-layer structure. The conductive bump 34 may include, for example, copper, nickel, tin, silver, other suitable materials, alloys of at least two of the foregoing, or a combination thereof, but not limited thereto.

In some embodiments, since the redistribution layer 16 may be formed before the active chips 32 are disposed, an automated optical inspection (AOI) and/or an open/short test (O/S test) may be optionally performed on the redistribution layer 16 before the active chips 32 are disposed, so as to ensure quality of the redistribution layer 16. Accordingly, chip loss or waste caused by defect of the redistribution layer 16 may be avoided or reduced. In some embodiments, the automated optical inspection and/or the open/short test may be performed after the redistribution layer 16 is completed or repeated multiple times during the formation of the redistribution layer 16.

As shown in FIG. 2, after the active chips 32 are disposed, an encapsulant 38 may be formed on the redistribution layer 16 to form a semi-finished structure 40, in which the encapsulant 38 may at least laterally surround the active chips 32 to protect the active chips 32 and the bonding between the active chips 32 and the redistribution layer 16. For example, the encapsulant 38 may be formed between the active chips 32 and on the back surfaces 32s of the active chips 32 through a molding process to seal the active chips 32 on the redistribution layer 16. The encapsulant 38 may include, for example, a molding compound or other suitable encapsulating material, but not limited thereto.

It should be noted that, since the redistribution layer 16 that is thinner than the carrier 12 is first formed on the rigid carrier 12 instead of being first formed on the encapsulant 38, the redistribution layer 16 does not have obvious warpage resulted from structure shrinkage or expansion. Accordingly, when the active chips 32 are bonded to the redistribution layer 16, there is no need to compensate pattern position shift of the redistribution layer 16 caused by the structure shrinkage or expansion, thereby improving manufacturing efficiency. For example, the pattern position shift of the redistribution layer 16 may refer to change of relative positions between bonding pads due to the structure shrinkage or expansion when the redistribution layer is formed on the encapsulant first, so that the flip-chip bonding process of active chips needs to compensate the pattern position shift.

In some embodiments, a thinning process may be optionally performed on the encapsulant 38 to remove a portion of the encapsulant 38 located on the active chips 32 and expose the back surfaces 32s of the active chips 32, thereby facilitating the heat dissipation of the active chips 32. The thinning process may include, for example, a chemical mechanical polishing (CMP) process, a mechanical grinding process, an etching process or other suitable processes, but not limited thereto.

In some embodiments, as shown in FIG. 2, between the step of disposing the active chips 32 on the redistribution layer 16 and the step of forming the encapsulant 38, a underfill layer 36 may be optionally filled between the active chips 32 and the redistribution layer 16 to strengthen the bonding between the active chips 32 and the redistribution layer 16, thereby reducing break between the conductive bumps 30 and the conductive bumps 34. The underfill layer 36 may include, for example, capillary underfill (CUF) or other suitable filling materials, but not limited thereto. The underfill layer 36 may be formed by, for example, a dispensing process.

Figure 3:
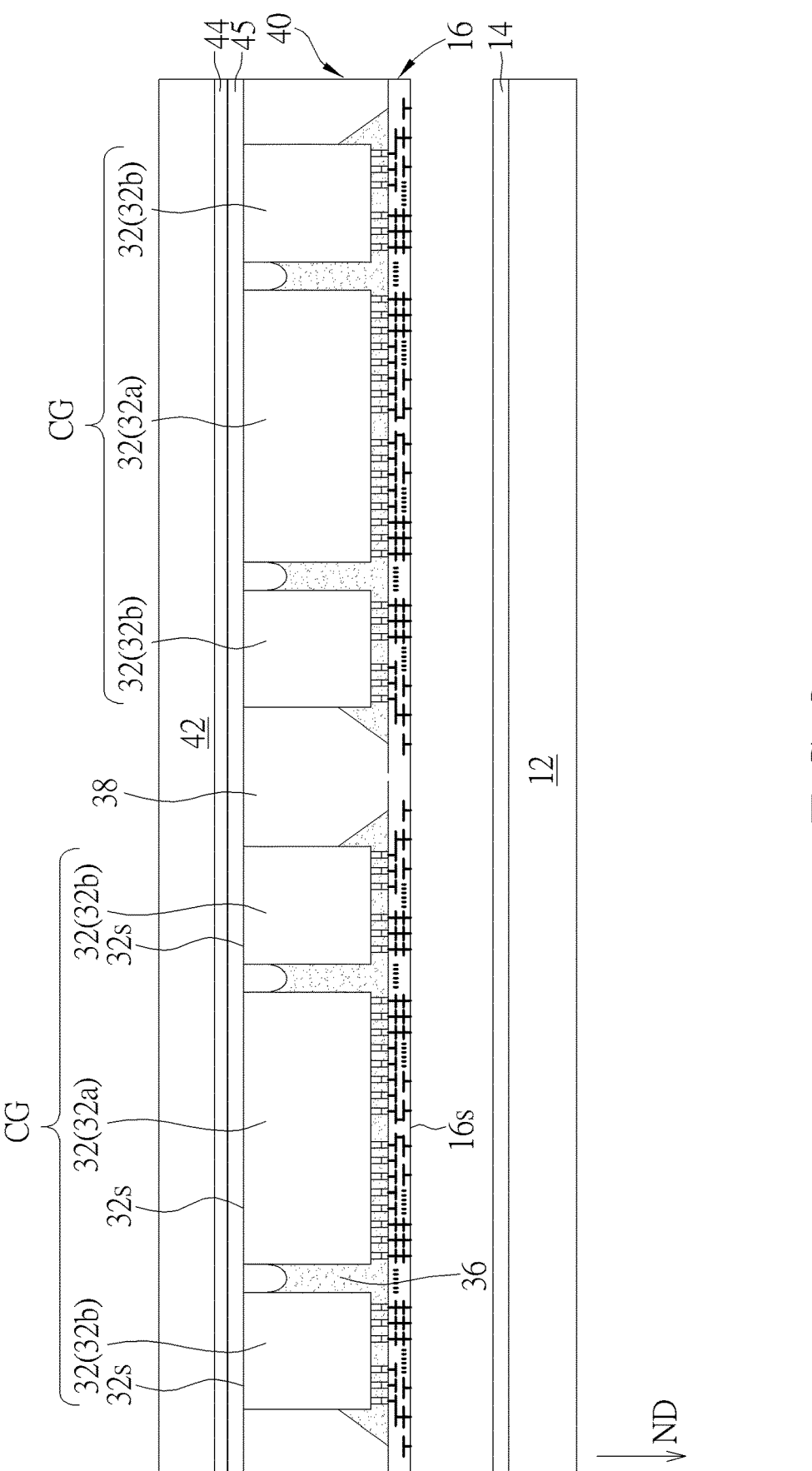

As shown in FIG. 3, the semi-finished structure 40 including the redistribution layer 16, the active chips 32 and the encapsulant 38 may be transferred to a carrier 42 to expose a surface 16s of the redistribution layer 16 opposite to the active chips 32. For example, after the encapsulant 38 is formed, the back surfaces 32s of the active chips 32 and a surface of the encapsulant 38 opposite to the redistribution layer 16 may be attached to the carrier 42 to reduce warpage of the semi-finished structure 40. For example, a release layer 44 and an adhesive layer 45 may be sequentially disposed on the carrier 42, and the semi-finished structure 40 may be attached to the carrier 42 by the adhesive layer 45, so that the release layer 44 and the adhesive layer 45 may be between the carrier 42 and the active chips 32 and between the carrier 42 and the encapsulant 38. The adhesive layer 45 may include a material for carrier bonding. The material of the release layer 44 may be, for example, the same as or similar to the material of the release layer 14 and will not be repeated herein. Then, the carrier 12 is removed. The manner of removing the carrier 12 may include, for example, irradiating the release layer 14 with light to reduce adhesion of the release layer 14, thereby removing the carrier 12, but not limited thereto.

Figure 4:
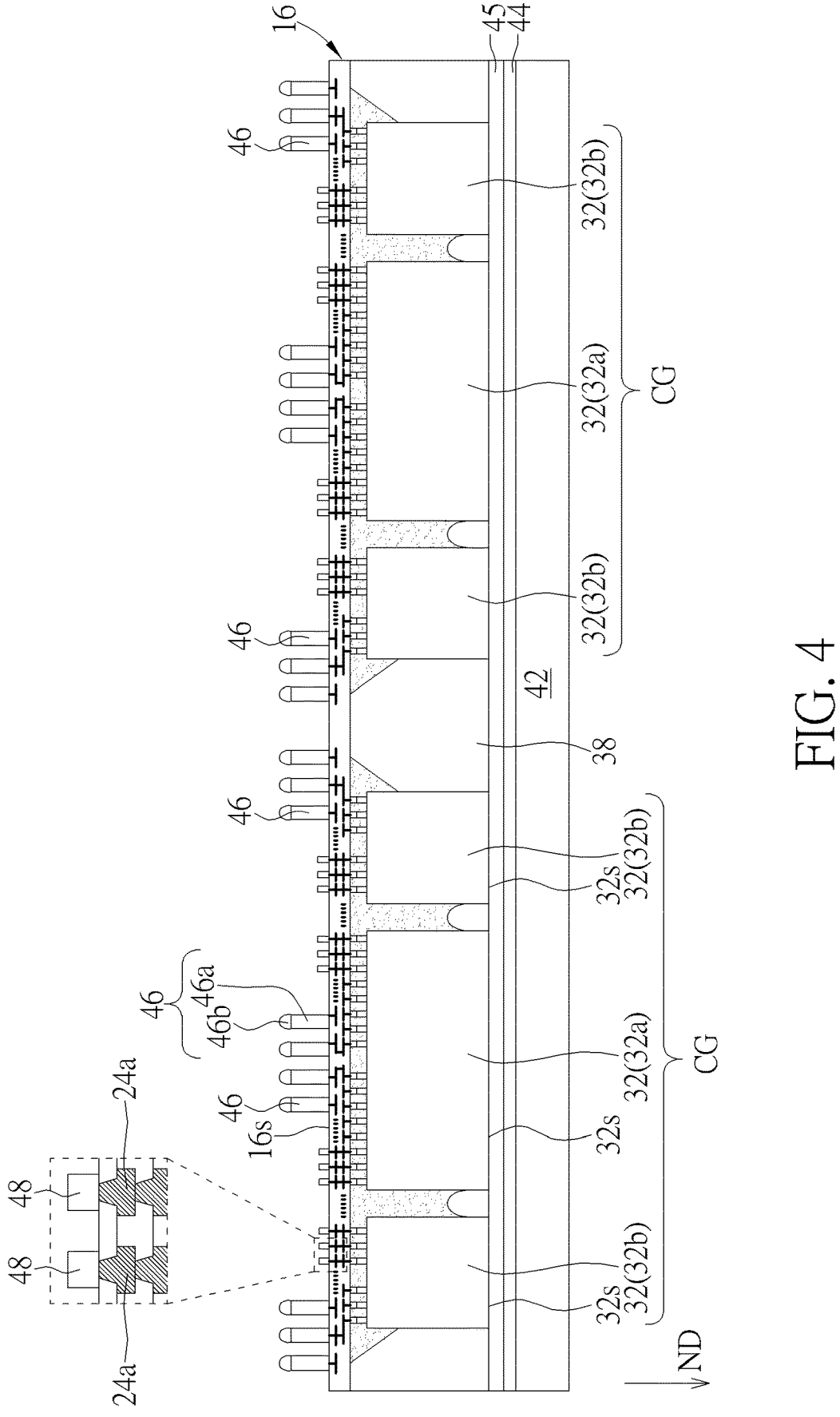

As shown in FIG. 4, the semi-finished structure 40 is then turned upside down, so that the surface 16s of the redistribution layer 16 opposite to the active chips 32 faces upward, and the back surfaces 32s of the active chips 32 face downward. Then, a plurality of conductive pillars 46 disposed side by side are formed on the surface 16s of the redistribution layer 16 opposite to the active chips 32, so that each conductive pillar 46 may be coupled to the corresponding trace 24a. Also, the conductive pillars 46 may be coupled to the active chips 32 through the redistribution layer 16. The conductive pillars 46 may be formed by, for example, a deposition process combined with a photolithography process and an etching process, an electroplating process combined with an etching process, or other suitable processes. In the embodiment of FIG. 4, one of the conductive pillars 46 may be, for example, a multi-layer structure, but not limited thereto. For example, the conductive pillar 46 may include a pillar portion 46a and a bonding portion 46b. The pillar portion 46a may include, for example, copper, aluminum, nickel, other suitable conductive materials, alloys of at least two thereof, or a combination thereof. The bonding portion 46b may include, for example, a tin-silver alloy, other suitable materials, or a combination thereof, but not limited thereto.

In some embodiments, a plurality of conductive pillars 48 may be optionally formed on the surface 16s of the redistribution layer 16 opposite to the active chips 32 to facilitate bonding with abridge chip disposed in a subsequent step. The conductive pillars 48 may be coupled to the corresponding active chips 32 through the redistribution layer 16. A height of one of the conductive pillars 48 may be less or much less than a height of one of the conductive pillars 46. In some embodiments, the conductive pillars 48 may be formed before or after the step of forming the conductive pillars 46. The conductive pillars 48 may be formed by, for example, a deposition process combined with a photolithography process and an etching process, an electroplating process combined with an etching process, or other suitable processes, but not limited thereto.

As shown in FIG. 5, after the conductive pillars 46 are formed, at least one bridge chip 50 may be disposed on the redistribution layer 16 in a face-down way through a flip-chip bonding process. In other words, the bridge chip 50 may have a plurality of conductive bumps 52, and during bonding, the bridge chip 50 is bonded to the redistribution layer 16 in a way of the conductive bumps 52 facing the redistribution layer 16 and a back surface 50b of the bridge chip 50 facing upward. One of the conductive bumps 52 may include, for example, a multi-layer structure. The conductive bump 52 may, for example, include copper, nickel, tin, silver, other suitable materials, alloys of at least two thereof, or a combination thereof, but not limited thereto. In the embodiment shown in FIG. 5, the bridge chip 50 may further include, for example, a body portion 50m, a plurality of pads 50p, and an insulating layer 50n, in which the pads 50p are disposed on the body portion 50m, and the insulating layer 50n is disposed on the pads 50p and the body portion 50m and may have a plurality of openings respectively exposing the corresponding pads 50p. The conductive bumps 52 are respectively formed on the corresponding pads 50p to facilitate bonding with the redistribution layer 16, but not limited thereto.

In the embodiment of FIG. 5, the conductive bumps 52 of the bridge chip 50 may be bonded to the conductive pillars 48 disposed on the redistribution layer 16, so as to be coupled to the redistribution layer 16. Accordingly, a single bridge chip 50 may be coupled to different active chips 32 through the redistribution layer 16. A metal solder (not shown) may be further included between one of the conductive bumps 52 and the corresponding conductive pillar 48 for bonding the conductive bump 52 to the corresponding conductive pillar 48. The metal solder may include, for example, tin alloy solder or other suitable materials, but not limited thereto. The bridge chip 50 may, for example, include a plurality of traces (not shown), in which a trace width and/or a space between two adjacent traces may be, for example, about 1 micron to 2 microns or sub-micron level, but not limited thereto. Since the trace pitch of the bridge chip 50 may be less than the trace pitch of the redistribution layer 16, interconnection density between the active chips 32 may be increased by coupling the bridge chip 50 to different active chips 32. Accordingly, signal transmission paths or signal transmission time between the active chips 32 may be reduced, thereby improving signal transmission efficiency. In this case, the trace pitch of the redistribution layer 16 may not need to reach the fine pitch, so as to simplify the manufacturing complexity and reduce manufacturing cost. In addition, the number of layers of the redistribution layer 16 may be reduced by using the bridge chip 50 with a less trace pitch, thereby mitigating warpage during the manufacturing process and reducing the manufacturing complexity.

In some embodiments, a distance between two adjacent conductive bumps (such as the conductive bumps 34 shown in FIG. 2) of the active chips 32 may be less than or equal to a distance between two adjacent conductive bumps 52 of the bridge chip 50. When the distance between the conductive bumps 34 is equal to the distance between the conductive bumps 52, the traces of the redistribution layer 16 coupled to one of the conductive bumps 52 and the corresponding conductive bump 34 (such as one of the traces 24a and the corresponding trace 26a shown in FIG. 1) and one of the conductive bumps (such as the conductive bump 30 shown in FIG. 1) may be aligned with each other in a normal direction ND perpendicular to a upper surface 42s of the carrier 42, but not limited thereto. In some embodiments, the distance between two adjacent conductive bumps 52 may be less than a distance between two adjacent conductive pillars 46. The number of the bridge chips 50 shown in FIG. 6 may be plural, but not limited thereto. The number of bridge chip 50 may be determined, for example, according to the number of the active chips 32 in the chip group CG and the number of the chip group CG.

In some embodiments, the bridge chip 50 may optionally further include a passive element, such as a resistor, a capacitor, an inductor, or other similar elements. In some embodiments, the bridge chip 50 may optionally further include an active element. In this case, the active element in the bridge chip 50 and the active element in the active chip 32 may be fabricated by different semiconductor process technology nodes. For example, density of the active elements in the bridge chip 50 is less than that of the active elements in the active chip 32, but not limited thereto. In some embodiments, a thickness of the bridge chip 50 in the normal direction ND may be, for example, about 10 micrometers to 100 micrometers or more.

As shown in FIG. 5, after the bridge chip 50 is disposed, an underfill layer 54 may be formed between the bridge chip 50 and the redistribution layer 16 to protect the bonding and coupling between the bridge chip 50 and the redistribution layer 16, thereby forming a semi-finished structure 56. In the embodiment of FIG. 5, the underfill layer 54 may extend between two adjacent conductive bumps 52 in the bridge chip 50. The material and forming manner of the underfill layer 54 may be, for example, the same as or similar to those of the underfill layer 36 and will not be described redundantly.

It should be noted that, as shown in FIG. 5, in order to prevent crack of the bridge chip 50 caused by the back surface 50b of the bridge chip 50 collided with a substrate during bonding the package structure to the substrate in a following step, a height H1 of one of the conductive pillars 46 may be greater than a height H2 of the back surface 50b of the bridge chip 50 (i.e., a distance between the back surface 50b of the bridge chip 50 and the surface 16s of the redistribution layer 16). Further, the height H1 of the conductive pillar 46 may still be higher than the height H2 of the back surface 50b of the bridge chip 50 after reflow. For example, the difference between the height H1 and the height H2 may be greater than or equal to 50 microns, but not limited thereto.

As shown in FIG. 6, after the semi-finished structure 56 is formed, the carrier 42 may be removed. The manner of removing the carrier 12 may include, for example, irradiating the release layer 44 with light to reduce the adhesion of the release layer 44, thereby removing the carrier 42, but not limited thereto. Then, a singulation process may be performed on the semi-finished structure 56 to form at least one package structure 58. In the embodiment of FIG. 6, the semi-finished structure 56 may include at least two chip groups CG, so that the singulation process may separate different chip groups CG from each other and separate the bridge chips 50 and the conductive pillars 46 corresponding to different chip groups CG from each other, so as to form at least two package structures 58. The singulation process may, for example, include a dicing process or other suitable processes.

As shown in FIG. 7, after the singulation process, the package structure 58 may be turned upside down, and the conductive pillars 46 of the package structure 58 may be disposed on the substrate 60. The conductive pillars 46 may couple and bond the package structure 58 to the substrate 60. Then, an underfill layer 62 is formed between two adjacent conductive pillars 46 of the package structure 58 and between the conductive pillars 46 and the bridge chip 50 to form the package device 1. It should be noted that, since only one underfill layer 62 needs to be disposed between the redistribution layer 16 and the substrate 60, the manufacturing steps and the manufacturing complexity of the package device 1 may be simplified. The substrate 60 may include, for example, a package substrate, a circuit board, or other suitable substrate. The underfill layer 62 may extend to sidewalls of the encapsulant 38 of the package structure 58 and may strengthen the bonding between the package structure 58 and the substrate 60. In the embodiment of FIG. 7, the underfill layer 62 may, for example, extend between the substrate 60 and the bridge chip 50. The material and forming manner of the underfill layer 62 may be, for example, the same as or similar to the material and forming manner of the underfill layer 36 or the underfill layer 54 and are not described herein again.

In some embodiments, a stiffener 64 may be disposed on the substrate 60, and the stiffener 64 may, for example, surround the package structure 58 and be spaced apart from the underfill layer 62. The stiffener 64 may include metal, for example. In some embodiments, solder balls 66 may be optionally disposed under the substrate 60 to facilitate coupling and bonding of the package element 1 with other elements, but not limited thereto.

It should be noted that, in the package device 1 of FIG. 7, since the redistribution layer 16 is disposed between the active chips 32 and the conductive pillars 46 and between the active chips and the bridge chip 50, the active chips 32 may be simultaneously coupled to the conductive pillars 46 and the pads of the bridge chip 50 that have different pitches. In addition, the active chips 32 may be coupled to the substrate 60 through the redistribution layer 16 and the conductive pillars 46. As compared with being coupled to the substrate 60 through a silicon interposer, the manufacturing cost of the conductive pillars 46 and the bridge chip

50 may be significant lower than that of the silicon interposer, thereby effectively decreasing the manufacturing cost of the package device 1.

Figure 8:
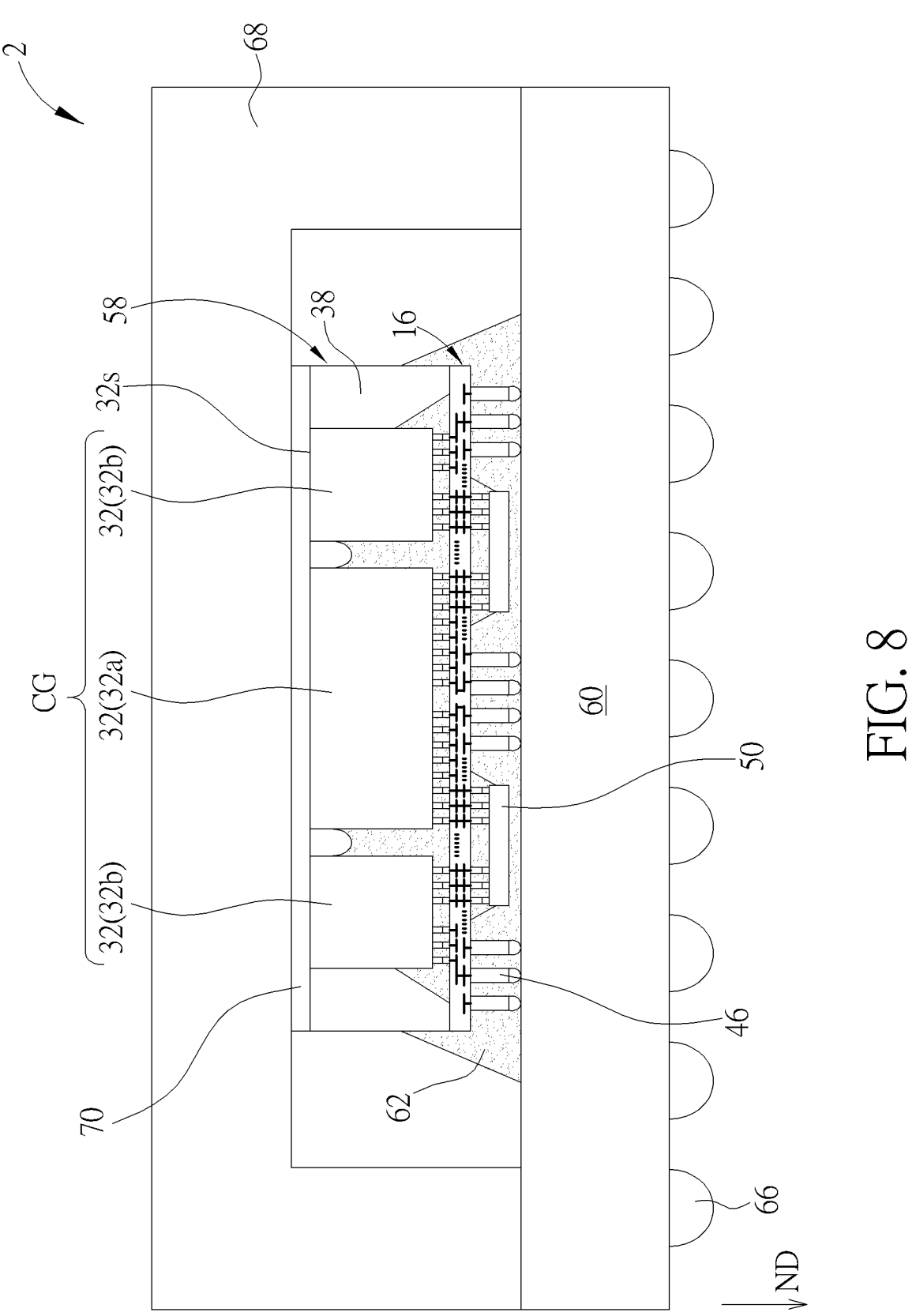
FIG. 8 schematically illustrates a cross-sectional view of a package device according to another embodiment of the present invention.

FIG. 8 schematically illustrates a cross-sectional view of a package device according to another embodiment of the present invention. As shown in FIG. 8, the package device 2 of this embodiment differs from the package element 1 shown in FIG. 7 in that the package device 2 may further include a metal cover 68 that replaces the stiffener 64 of FIG. 7 and is disposed on the package structure 58 and the substrate 60. The metal cover 68 may cover and surround the package structure 58 to protect the package structure 58, for example. The metal cover 68 may be, for example, an integrally formed structure, but not limited thereto. In some embodiments, the package device 2 may optionally further include a thermal grease 70 disposed on the back surfaces 32s of the active chips 32. The thermal grease 70 may, for example, directly contact the active chips 32 and the metal cover 68 to facilitate heat dissipation of the active chips 32. The thermal grease 70 may, for example, be coated on the back surfaces of the active chips 32 before disposing the metal cover 68, but not limited thereto.

In summary, in the package device of the present invention, the bridge chip is used to couple different active chips, so that the interconnection density between the active chips may be increased, thereby improving the signal transmission efficiency. Moreover, since the height of the conductive pillars arranged side by side with the bridge chip may be greater than the height of the back surface of the bridge chip, when the package structure is bonded to the substrate, the bridge chip may be prevented from colliding with the substrate, thereby reducing crack of the bridge chip. In addition, the redistribution layer may be disposed between the active chips and the conductive pillars and between the active chips and the bridge chip, so that the active chips may be coupled to the conductive pillars and the pads of the bridge chip that have different pitches through the redistribution layer and may be coupled to the substrate through the conductive pillars. Accordingly, the manufacturing cost of the package device may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package device, comprising:

a substrate;

a plurality of first conductive pillars disposed on the substrate side by side;

a redistribution layer disposed on the first conductive pillars;

at least one bridge chip disposed between the substrate and the redistribution layer, wherein the bridge chip comprises a plurality of conductive bumps;

a plurality of second conductive pillars disposed between the conductive bumps of the bridge chip and the redistribution layer, wherein the conductive bumps are bonded to the second conductive pillars, respectively;

at least two active chips disposed on the redistribution layer, wherein the bridge chip is coupled between the active chips;

an encapsulant disposed on the redistribution layer and surrounding the active chips; and a first underfill layer disposed between adjacent two of the first conductive pillars and between one of the first conductive pillars and the bridge chip, wherein the bridge chip is separated from the substrate by the first underfill layer, and the first underfill layer extends to and contacts a sidewall of the encapsulant.

2. The package device according to claim 1, further comprising a second underfill layer disposed between the bridge chip and the redistribution layer.

3. The package device according to claim 2, wherein the second underfill layer is disposed between adjacent two of the conductive bumps.

4. The package device according to claim 1, wherein a distance between adjacent two of the conductive bumps is less than a distance between adjacent two of the first conductive pillars.

5. The package device according to claim 1, further comprising a third underfill layer disposed between the redistribution layer and the active chips.

6. The package device according to claim 1, wherein a height of one of the first conductive pillars is greater than a distance between a back surface of the bridge chip and a surface of the redistribution layer opposite to the active chips.

7. A manufacturing method of a package device, comprising:

forming a redistribution layer on a first carrier;

disposing at least two active chips on the redistribution layer;

forming an encapsulant on the redistribution layer, wherein the encapsulant surrounds the active chips;

transferring the redistribution layer, the active chips and the encapsulant to a second carrier to expose a surface of the redistribution layer opposite to the active chips;

forming a plurality of first conductive pillars on the surface of the redistribution layer opposite to the active chips;

disposing at least one bridge chip on the redistribution layer;

removing the second carrier after forming the first conductive pillars and disposing the bridge chip;

bonding the first conductive pillars to a substrate after removing the second carrier; and forming a first underfill layer between the first conductive pillars and between one of the first conductive pillars and the bridge chip after bonding the first conductive pillars to the substrate.

8. The manufacturing method of the package device according to claim 7, wherein the first underfill layer is disposed between the substrate and the bridge chip.

9. The manufacturing method of the package device according to claim 7, wherein between disposing the bridge chip and removing the second carrier, the manufacturing method further comprises forming a second underfill layer between the bridge chip and the redistribution layer.

10. The manufacturing method of the package device according to claim 7, wherein a height of one of the first conductive pillars is greater than a distance between a back surface of the bridge chip and a surface of the redistribution layer opposite to the active chips.

11. The manufacturing method of the package device according to claim 7, wherein the bridge chip comprises a plurality of conductive bumps, and disposing the bridge chip comprises bonding the bridge chip on the redistribution layer in a way of the conductive bumps facing the redistribution layer.

12. The manufacturing method of the package device according to claim 11, wherein a distance between adjacent two of the conductive bumps is less than a distance between adjacent two of the first conductive pillars.

13. The manufacturing method of the package device according to claim 7, wherein before disposing the bridge chip, the manufacturing method further comprises forming a plurality of second conductive pillars on the surface of the redistribution layer opposite to the active chips.

14. The manufacturing method of the package device according to claim 13, wherein a height of one of the second conductive pillars is less than a height of one of the first conductive pillars.

15. The manufacturing method of the package device according to claim 7, wherein forming the encapsulant comprises performing a thinning process on the encapsulant to expose back surfaces of the active chips.

16. The manufacturing method of the package device according to claim 7, wherein between forming the redis-tribution layer and disposing the active chips, the manufac-turing method further comprises performing an automated optical inspection on the redistribution layer.

17. The manufacturing method of the package device according to claim 7, wherein between disposing the active chips and forming the encapsulant, the manufacturing method further comprises forming a third underfill layer between the redistribution layer and the active chips.

18. The package device according to claim 1, wherein the substrate comprises a package substrate or a circuit board, and each of the first conductive pillars comprises a pillar portion and a bonding portion disposed between the pillar portion and the substrate, wherein the bonding portion is in direct contact with the first underfill layer, the pillar portion comprises copper, aluminum or nickel, and the bonding portion comprises tin-silver alloy.

* * * * *